United States Patent
Ahn et al.

(10) Patent No.: US 9,583,633 B2
(45) Date of Patent: Feb. 28, 2017

(54) OXIDE FOR SEMICONDUCTOR LAYER OF THIN FILM TRANSISTOR, THIN FILM TRANSISTOR AND DISPLAY DEVICE

(71) Applicant: SAMSUNG DISPLAY CO., LTD., Yongin-si, Gyeonggi-Do (KR)

(72) Inventors: Byung Du Ahn, Hwaseong-si (KR); Gun Hee Kim, Hwaseong-si (KR); Yeon-Hong Kim, Hwaseong-si (KR); Jin Hyun Park, Yongin-si (KR); Shuji Kosaka, Kobe (JP); Kazushi Hayashi, Kobe (JP)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/392,369

(22) PCT Filed: Feb. 27, 2014

(86) PCT No.: PCT/JP2014/054958
§ 371 (c)(1),
(2) Date: Sep. 8, 2015

(87) PCT Pub. No.: WO2014/136659
PCT Pub. Date: Sep. 12, 2014

(65) Prior Publication Data
US 2016/0211384 A1    Jul. 21, 2016

(30) Foreign Application Priority Data
Mar. 8, 2013  (JP) .................... 2013-047347

(51) Int. Cl.
*H01L 29/10*  (2006.01)
*H01L 21/00*  (2006.01)
(Continued)

(52) U.S. Cl.
CPC ...... *H01L 29/7869* (2013.01); *H01L 27/1225* (2013.01); *H01L 29/66969* (2013.01); *H01L 21/02554* (2013.01); *H01L 21/02565* (2013.01)

(58) Field of Classification Search
CPC ..................... H01L 29/7869; H01L 27/1225
(Continued)

(56) References Cited

U.S. PATENT DOCUMENTS 8,232,552 B2 * 7/2012 Yano ..................... C23C 14/086
257/347
8,242,504 B2 * 8/2012 Kim ..................... H01L 29/7869
257/66
(Continued)

FOREIGN PATENT DOCUMENTS

CN    103155154    6/2013
CN    103229302    7/2013
(Continued)

OTHER PUBLICATIONS

PCT/JP2014/054958—International Search Report and Written Opinion in Japanese.

*Primary Examiner* — Calvin Lee
(74) *Attorney, Agent, or Firm* — F. Chau & Associates, LLC

(57) ABSTRACT

In an oxide for a semiconductor layer of a thin film transistor according to the present invention, wherein metal elements constituting the oxide are In, Zn, and Sn, an oxygen partial pressure is 15% by volume or more when depositing the oxide in the semiconductor layer of the thin film transistor, and a defect density of the oxide satisfies $7.5 \times 10^{15} \text{cm}^{-3}$ or less, and a mobility satisfies 15 cm2/Vs or more.

6 Claims, 5 Drawing Sheets

(51) Int. Cl.
*H01L 29/786* (2006.01)
*H01L 29/66* (2006.01)
*H01L 27/12* (2006.01)
*H01L 21/02* (2006.01)

(58) Field of Classification Search
USPC ............... 438/93, 104, 603; 257/43, 76, 613
See application file for complete search history.

(56) References Cited

U.S. PATENT DOCUMENTS

| | | | | |
|---|---|---|---|---|
| 9,184,300 | B2* | 11/2015 | Son | H01L 29/78618 |
| 9,318,507 | B2* | 4/2016 | Miki | H01L 27/1225 |
| | | | | 257/43 |
| 2010/0155717 | A1 | 6/2010 | Yano et al. | |
| 2011/0272696 | A1 | 11/2011 | Ryu et al. | |
| 2012/0220078 | A1 | 8/2012 | Hosoba et al. | |
| 2015/0364553 | A1* | 12/2015 | Kosaka | H01L 29/66969 |
| | | | | 252/519.15 |

FOREIGN PATENT DOCUMENTS

| | | |
|---|---|---|
| JP | 2008243928 | 10/2008 |
| JP | 2011-171516 | 9/2011 |
| JP | 2012104809 | 5/2012 |
| JP | 2012164963 | 8/2012 |
| JP | 2012238678 | 12/2012 |
| JP | 2013-048217 | 3/2013 |
| TW | 200845399 | 11/2008 |
| TW | 201008893 | 3/2010 |
| TW | 201222825 | 6/2012 |
| TW | 201234497 | 8/2012 |
| TW | 201301524 | 1/2013 |
| WO | 2008117810 | 10/2008 |
| WO | 2012049830 | 4/2012 |
| WO | 2012070675 | 5/2012 |
| WO | 2012153494 | 11/2012 |
| WO | 2014136659 | 9/2014 |

* cited by examiner

OXIDE FOR SEMICONDUCTOR LAYER OF THIN FILM TRANSISTOR, THIN FILM TRANSISTOR AND DISPLAY DEVICE

CROSS-REFERENCE TO RELATED APPLICATIONS

This application claims the benefit of priority to published PCT Application No. PCT/JP2014/054958, filed on Feb. 27, 2014, which claims the priority to Japan Patent Application No. 2013-047347, filed on Mar. 8, 2013, in the Japan Patent Office, the disclosure of which is incorporated by reference in their entirety herein.

TECHNICAL FIELD

The present invention relates to an oxide for a semiconductor layer of a thin film transistor (hereinafter referred to as "TFT"), a thin film transistor, and a display device. In detail, the present invention relates to an oxide for a semiconductor layer of a thin film transistor preferably used in a display device such as a liquid crystal display or an organic Electro Luminescence (EL) display, a TFT including the oxide for the semiconductor layer, and a display device including the TFT.

DESCRIPTION OF THE RELATED ART

An amorphous oxide semiconductor has higher carrier mobility than a general amorphous silicon (a-Si) and a large optical bend gap, such that film formation may be realized at a low temperature. Therefore, the application for a next generation display in which a large size, high resolution, and high speed driving are required, or a resin substrate having a low heat-resistance characteristic, is expected.

Among the oxide semiconductor, the amorphous oxide (In—Zn—Sn—O, hereinafter referred to as ⌈C IZTO⌋) made of indium, zinc, tin, and oxygen has a high carrier mobility such that it is preferably used in the semiconductor layer of the TFT.

When using the oxide semiconductor as the semiconductor layer of thin film transistor, not only is the carrier concentration (mobility) high, but it is also important to reduce the defect density of the semiconductor layer.

For example, Patent Document 1 discloses a method in which a semiconductor gas made of the oxide semiconductor is exposed to hydrogen plasma or a hydrogen radical, and then the semiconductor gas is exposed in a water vapor atmosphere, in order to reduce defects due to a non-uniform composition of the oxide semiconductor and to improve transfer characteristics of the oxide semiconductor.

PRIOR ART DOCUMENT

Patent Document

Japanese Patent Laid-Open Publication No. 2011-171516

The above information disclosed in this Background section is only to enhance the understanding of the background of the invention, and therefore it may contain information that does not form the prior art that is already known in this country to a person of ordinary skill in the art.

SUMMARY OF THE INVENTION

Objects to be Solved

The present invention provides an oxide for the semiconductor layer of a thin film transistor in which the mobility is high and the defect density is reduced. The present invention provides a thin film transistor including an oxide for the semiconductor layer, along with a display device including the same.

Means for Objects

In an oxide for a semiconductor layer of a thin film transistor according to the present invention used as an oxide in the semiconductor layer of the thin film transistor, wherein metal elements constituting the oxide are In, Zn, and Sn, an oxygen partial pressure is not more than 15% by volume when depositing the oxide in the semiconductor layer of the thin film transistor, and a defect density of the oxide satisfies $7.5 \times 10^{15} cm^{-3}$ or less, and a mobility satisfies 15 cm2/Vs or more.

When the content (atomic %) of each metal element of the total metal elements in the oxide, except for oxygen, is respectively referred to as [In], [Zn] and [Sn], the relation of 1≤[In], 50≤[Zn]≤95, 1≤[Sn]≤30 is satisfied.

The oxygen partial pressure is 40% by volume or less.

A thin film transistor in which the oxide for the semiconductor layer of claim 3 is provided in the semiconductor layer of the thin film transistor is included.

In addition, a display device in which the thin film transistor of claim 4 is provided is included.

Effects

According to the present invention, the oxide for the semiconductor layer of the thin film transistor in which mobility is high and defect density is reduced may be provided. By using the thin film transistor including the oxide for the semiconductor layer of the present invention, a display device having high reliability may be obtained.

DETAILED DESCRIPTION OF THE EMBODIMENTS

Figure 1:
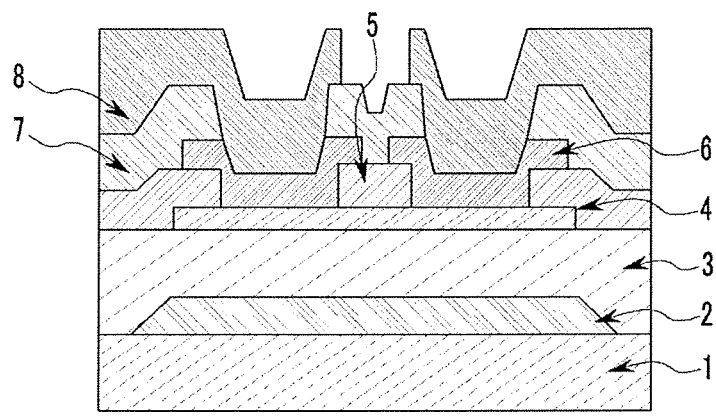
FIG. 1 is a schematic cross-sectional view to explain a thin film transistor of the present invention.

The present Inventors, to provide an oxide for the semiconductor layer of the thin film transistor having high mobility and reduced defect density, particularly conducted review for In—Zn—Sn—O (IZTO) of In, Zn, and Sn as metal elements for configuring the oxide. The measuring of the defect density uses the Isothermal Capacitance Transient Spectroscopy (ICTS) method.

As a result, as in the prior art, dust for measuring the drain current-the gate voltage characteristic (Id-Vg characteristic) of the TFT and to calculate the mobility are insufficient. In detail, when viewed at a glance, even among the TFT in which the Id-Vg characteristic is the same, if the defect density is measured by the ICTS method, the magnitude thereof may be different, and thus it has been found that the mobility is also changed. That is, in addition to controlling the mobility, to precisely grasp the defect density was found to be indispensable.

Therefore, as a result of extensive study, if the oxygen partial pressure when depositing the IZTO is appropriately controlled, it was found that both the high mobility and the low defect density can be achieved, and the present invention is completed.

Here, the ICTS method used for measuring the defect density will be simply described.

The ICTS method is a kind of Capacitance Transient Spectroscopy and is known as one of the methods for precisely measuring atom impurity included in the semiconductor layer or a localization potential, which causes defects such as an interface trap or a bulk trap. The capacitance transient spectroscopy measures excess capacitance of the information of the localization level since a depletion layer width corresponds to an inverse of a time variation $C(t)$ of a junction capacitance (C). The measuring method of the excess capacitance, as well as the ICTS method, includes a Deep Level Transient Spectroscopy (DLTS) method. The measuring principle for both is the same, but the measuring methods thereof are different. In the DLTS method, compared with obtaining a DLTS signal while changing a sample temperature, the ICTS method modulates an application pulse under a predetermined temperature to change a release time constant, thereby obtaining the same information as the DLTS signal. Until now, a technique in which the defect density of the oxide for the semiconductor layer such as the IZTO is specifically measured by the ICTS method and high mobility is obtained while reducing defect density has not been suggested.

Hereinafter, the present invention will be described in detail.

As described above regarding the oxide for the semiconductor layer of the thin film transistor according to the present invention, the metal element constituting the oxide is made of In, Zn, and Sn, and an oxygen partial pressure when depositing the oxide in the semiconductor layer of the thin film transistor is 15% by volume or more. In addition, there are features of the present invention in which the defect density of the oxide (IZTO) is as low as $7.5 \times 10^{15}$ cm$^{-3}$ or less, and the mobility satisfies a very high level of 15 cm2/Vs or more. In the case of the IZTO targeted in the present invention, for the characteristic of the oxide, the IZTO originally only has high mobility, however the mobility may be boosted to an even higher level by the reduction of the defect density through the appropriate control of the oxygen partial pressure when depositing the IZTO like in the present invention.

In the oxide, when the content (atomic %) of each metal element for an entire metal element, except for oxygen, is respectively referred to as [In], [Zn], and [Sn], it is preferable to satisfy 1≤[In], 50≤[Zn]≤95, 1≤[Sn]≤30.

An operation of the metal element will be schematically described.

First, In has an effect of increasing the carrier, thereby increasing the mobility. [In] is preferably 1 or more, more preferably 5 or more, and even more preferably 10 or more. However, if an amount of In is increased, the carrier is too large, in addition to being conductive, and stability for the stress is deteriorated. [In] is preferably 30 or less, and more preferably 20 or less.

Sn has an operation for improving liquid immunity of the oxide semiconductor layer, such as a wet etching. In view of improving the liquid immunity, an amount of Sn is more desirable. It is preferably one or more, more preferably 10 or more, and even more preferably at least 20. However, when the Sn amount is increased, because the etching workability deteriorates, the upper limit is preferably 30 or less, more preferably 27 or less, and even more preferably 25 or less.

Zn has been considered to contribute to the stabilization of the amorphous structure. In addition, since Zn contributes to improving the stability of the stress, the Zn amount is more preferred. It is preferably at least 50, more preferably at least 53, and even more preferably at least 55. However, if the Zn amount is increased, because the oxide semiconductor film is crystallized, or a residue occurs at the time of etching, the Zn amount is preferably 95 or less, more preferably 80 or less, and most preferably no more than 60.

The oxide of the present invention satisfies that the defect density is $7.5 \times 1015$ cm$^{-3}$ or less and the mobility is 15 cm2/Vs or more. A lower defect density is preferred, and preferably $7.0 \times 1015$ cm−3 or less, and more preferably $6.5 \times 1015$ cm−3 or less. On the other hand, a high mobility is suitable, preferably 16 cm2/Vs or more, and more preferably 17 cm2/Vs or more.

The oxide is preferably deposited by a sputtering method using a sputtering target. According to the sputtering method, the thin film within components and the film surface having excellent uniformity of the film thickness may be easily formed.

Here, like the present invention, in order to obtain the oxide in which the defect density and the mobility are appropriately controlled, the oxygen partial pressure is controlled when depositing the oxide in the semiconductor layer of the thin film transistor, that is, a volume ratio of oxygen for an entire atmosphere gas is 15% by volume or more. In view of the defect density of the oxide being as small as possible, the oxygen partial pressure is more preferably higher, preferably at least 20% by volume. However, if the oxygen partial pressure is excessive, since the mobility tends to be deteriorated, the upper limit is preferably less than 40% by volume, and more preferably a maximum of 30% by volume.

The present invention also includes the thin film transistor in which any one oxide for the semiconductor layer described above is provided in the semiconductor layer of the thin film transistor. In the manufacturing of the thin film transistor, as described above, except for controlling the oxygen partial pressure when depositing the semiconductor layer, the present invention is not particularly limited, and generally used methods may be employed.

The preferred film thickness of the semiconductor layer is generally 30 nm or more. If the film thickness is thin, in addition to not obtaining the sufficient operating current, non-uniformity is generated at the time of the film formation by sputtering, causing distribution to be generated in the transistor characteristic. As a result, a final problem such as display unevenness, etc., occurs. The lower limit thereof is more preferably at least 35 nm. On the other hand, the upper limit thereof is preferably not more than 200 nm. When the film thickness is thick, the depletion layer does not spread well when there is a change in the gate voltage. As a result, the transistor is not turned off, i.e., the current may not be blocked, or even if the transistor is turned off, the gate voltage to be turned off is shifted more to the minus side than a normal gate voltage, and is thereby not suitable for the display operation. The upper limit thereof is more preferably 150 nm or less, and even more preferably not more than 80 nm.

Next, an embodiment of the manufacturing method of the TFT will be described with reference to the TFT of FIG. 1. FIG. 1 and the following manufacturing method are an example of a preferred embodiment of the present invention, and it is not intended to be limited to this. For example, FIG. 1 shows the structure of a bottom gate type TFT, however the embodiment of the present invention is not limited thereto. The present invention may also be applied to a top gate type TFT in which a gate insulating layer and a gate electrode are sequentially provided on the oxide semiconductor layer.

As shown in FIG. 1, a gate electrode 2 and a gate insulating layer 3 are formed on a substrate 1, and an oxide semiconductor layer 4 is formed thereon. A passivation layer 5 is formed on the oxide semiconductor layer 4, a source/drain electrode 6 is formed thereon, a surface passivation layer 7 is again formed thereon, a transparent conductive layer 8 is formed in an outermost surface, and the transparent conductive layer 8 is electrically connected to the source/drain electrode 6. In the passivation layer 5, an insulating layer such as a silicon oxide layer ($SiO_2$ layer) is used.

The method forming the gate electrode 2 and the gate insulating layer 3 on the substrate 1 is not particularly limited, and generally used methods may be applied. Also, the gate electrode 2 and gate insulating layer 3 are not particularly limited, and universal methods may be used. For example, the metal thin film of Al or Cu, alloy thin films, or a Mo thin film used in an exemplary embodiment that will be described later may be used as the gate electrode 2. Further, a silicon oxide film (SiO2 film), a silicon nitride film (SiN film), and a silicon oxynitride film (SiON film) are representatively illustrated as the gate insulating layer 3.

Next, the oxide semiconductor layer 4 is formed. The oxide semiconductor layer 4 may be deposited by the sputtering method, as described above. Preferably, by using the sputtering target of the same composition as the oxide semiconductor layer 4, the film may be formed by a Direct Current (DC) sputtering method or a Radio Frequency (RF) sputtering method. Also, the film may be formed by a co-sputter method.

In the film formation of the oxide semiconductor layer 4, as described above, the oxygen partial pressure is controlled to be more than 15% by volume.

Next, for the oxide semiconductor layer 4, a patterning is performed by photo lithography and a wet etching. Directly after the patterning, to improve a membranous of the oxide semiconductor layer 4, for example, a heat treatment (pre-annealing) may be carried out under a condition of a heating temperature of: 250-350° C., and a heating time of: 15-120 minutes. It is preferable that the heating temperature be: 300-350° C., and the heating time be: 60-120 minutes. Accordingly, an on current and an electric field effect mobility of the transistor characteristic are increased, thereby improving the transistor performance.

After the pre-annealing, to protect the surface of the oxide semiconductor layer 4, a silicon oxide layer ($SiO_2$ layer) may, for example, be formed as the passivation layer 5 by the above-descried method.

Next, to contact the oxide semiconductor layer 4 with the source/drain electrode 6 that is formed later, the photo lithography and a dry etching are performed for patterning.

Next, the source/drain electrode 6 is formed. The kind of source/drain electrode 6 is not particularly limited, and generally-used materials may be used. For example, like the gate electrode 2, metal such as Al or Cu or alloys thereof may be used, and like the following exemplary embodiment, Mo thin film may also be used.

The metal thin film may be applied with a lift off method as the method of forming the source/drain electrode 6, for example, after forming the metal thin film by a magnetron sputtering method.

Next, a surface passivation layer (insulating layer) 7 is formed on the source/drain electrode 6. The surface passivation layer 7, for example, may be formed by a Chemical Vapor Deposition (CVD) method. The silicon oxide layer ($SiO_2$ layer), a silicon nitride layer (SiN layer), a silicon oxynitride layer (SiON layer), or deposition layers thereof may be used as the surface passivation layer 7.

Next, by the photo lithography and the dry etching, after forming a contact hole in the surface passivation layer 7, a transparent conductive layer 8 is formed. The kind of transparent conductive layer 8 is not particularly limited and may be selected from what is commonly used.

In the present invention, the display device of the above-described TFT is included. Examples of the display device, for example, are a liquid crystal display or an organic EL display.

The present invention claims priority based on Japanese Patent Application number 2013-47347, filed on Mar. 8, 2013. The entire contents of the specification of Japanese Patent Application number 2013-47347 filed on Mar. 8, 2013, is incorporated herein by reference.

An Exemplary Embodiment

Hereafter, the present invention is described in more detail through exemplary embodiments, though the present invention is not limited to the below exemplary embodiments, and it may be carried out by adding variations in ranges appropriate for a former or latter purpose, and they are all included in the technical range of the present invention.

Exemplary Embodiment 1

In the present exemplary embodiment, the TFT is manufactured as follows, the mobility and the defect density by the ICTS method are measured. The TFT used in the present exemplary embodiment is equal to the configuration of FIG. 1, except for omitting the passivation layer to protect the surface of the oxide semiconductor layer (IZTO thin film) in the above-described FIG. 1.

First, on a glass substrate (Corning manufactured Eagle XG, diameter 100 mm×thickness 0.7 mm), the Mo thin film with the film thickness of 100 nm as the thin film for the gate electrode is formed and patterned by known methods to form the gate electrode. The Mo thin film is formed by the RF sputtering method using a pure Mo sputtering target under the conditions of the film formation temperature at room temperature, the film formation power at 300 W, the carrier gas being Ar, the gas pressure at 2 mTorr.

Next, the $SiO_2$ layer of 250 nm is formed as the gate insulating layer. The film formation of the gate insulating layer uses the plasma CVD method and is performed under the conditions of the carrier gas being a mixture gas of $SiH_4$ and $N_2{}_1O$, the film formation power at 300 W, and the film formation temperature at 320° C.

Next, the IZTO thin film is deposited as the oxide semiconductor layer by the sputtering method using the IZTO sputtering target under the film formation conditions below. The film thickness of the IZTO thin film is about 40 nm, and the composition of the atomic ratio is In:Zn:Sn=20:56.7:23.3.

(the film formation condition IZTO of the thin film)

The sputtering apparatus: 「C CS-200」 manufactured by ULVAC, Inc.

The substrate temperature: room temperature

The gas pressure: 1 mTorr

The oxygen partial pressure: [$O_2$/(Ar+$O_2$)]×100=4% by volume, 10% by volume, 20% by volume, and 30% by volume As described above, after forming the oxide semiconductor layer, the oxide semiconductor layer is patterned by photo lithography and wet etching. 「C ITO-07 N」 (a mixture of oxalic and water) manufactured by KANTO CHEMICAL CO., INC. is used as a wet etchant, and a liquid temperature is 40° C.

As described above, after the oxide semiconductor layer is patterned, to improve the film quality of the oxide semiconductor layer, pre-annealing is performed. The pre-annealing is process performed under atmospheric pressure for 1 hour at 350° C.

Next, the pure Mo is used and is patterned by the lift off method to form the source/drain electrode. In detail, after forming and patterning a photo resist, the Mo thin film with the film thickness of 100 nm is deposited by the DC sputtering method. The film formation method of the Mo thin film for the source/drain electrode is the same as the above-described gate electrode. Next, an unnecessary photo resist is removed in an acetone solution through an ultrasonic wave cleaner, the channel length of the TFT is 10 μm, and the channel width is 200 μm.

As described above, after forming the source/drain electrode, the surface passivation layer is formed to protect the oxide semiconductor layer. A deposition layer with the film thickness of 350 nm, which is the sum of the $SiO_2$ layer with the film thickness of 200 nm and the SiN layer with the film thickness of 150 nm, is formed as the surface passivation layer. To form the $SiO_2$ layer and the SiN layer, 「C PD-220 NL」 manufactured by SAMCO Inc. is used, and the plasma CVD method is used. In the present exemplary embodiment, the $SiO_2$ film and the SiN film are formed in order. A mixture gas of $N_2O$ and $SiH_4$ is used to form the $SiO_2$ layer, and a mixture gas of $SiH_4$, $N_2$, $NH_3$ is formed to form the SiN layer. The film formation temperature is 230° C. for an initial thickness of 100 nm for the film thickness of 200 nm for the $SiO_2$ layer and is 150° C. for the rest of the film thickness of 100 nm for the $SiO_2$ layer and for the SiN layer of the film thickness of 150 nm. All of the film formation power is 100 W.

Next, by the photo lithography and the dry etching, the surface passivation layer is formed with a contact hole for probing to evaluate the transistor characteristic, and the TFT is manufactured.

The TFT obtained as described above is used, and the transistor characteristic (the drain current-gate voltage characteristic, the Id-Vg characteristic), the electric field effect mobility, and the defect density are measured.

1) Measuring of the Transistor Characteristic

The measuring of the transistor characteristic (the TFT characteristic) uses a semiconductor parameter analyzer from Agilent Technologies Manufacturing Co. 「C 4156C」. The measuring is performed so as to set the probe in the contact hole of the sample. The detailed measuring conditions are as follows.

The source voltage: 0V
The drain voltage: 10V
The gate voltage: −30V-30V(a measuring interval: 0.25V)
The substrate temperature: room temperature 2) The Electric Field Effect Mobility μFE The electric field effect mobility $\mu_{FE}$ is deduced in a saturation region of Vd>Vg−$V_{th}$ from the TFT characteristic. In the saturation region, Vg and $V_{th}$ are respectively the gate voltage and the threshold value voltage, Id is the drain current, L and W are respectively the channel length and the channel width of the TH element, $C_i$ is the capacitance of the gate insulating layer, $\mu_{FE}$ is the electric field effect mobility, and $\mu_{FE}$ is deduced from an equation below. In the present exemplary embodiment, the electric field effect mobility $\mu_{FE}$ is deduced from the drain current-gate voltage characteristic (the Id-Vg characteristic) near the gate voltage satisfying the saturation region.

$$\mu_{FE} = \frac{\partial I_d}{\partial V_g}\left(\frac{L}{C_i W(V_g - V_{th})}\right) \quad \text{[Equation 1]}$$

3) Measuring of the Defect Density by the ICTS Method

Figure 2:
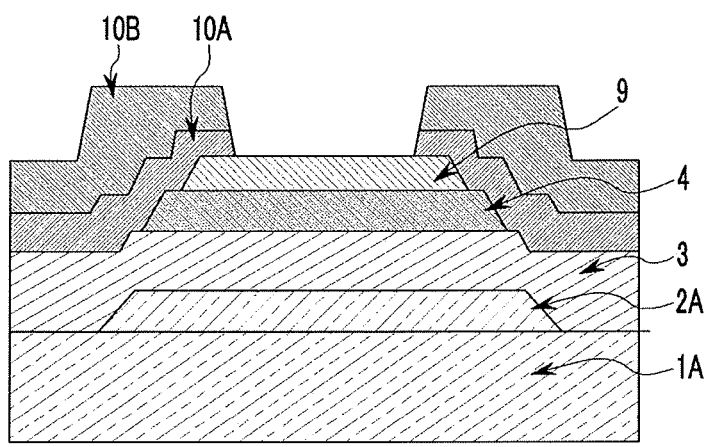
FIG. 2 is a schematic cross-sectional view to explain a Metal Insulator Semiconductor (MIS) structure element used to measure defect density by an ICTS method in an exemplary embodiment.

In the ICTS method, an electronic trap is trapped by applying a foreword direction pulse to the semiconductor junction portion of the reverse bias state, it returns to the reverse bias state, a process in which the trapped electron emitted by the thermal excitation process is detected as a transient change in the junction capacity to investigate the nature of the trap. In the present exemplary embodiment, the defect density by the ICTS method is measured by using the MIS structure element of FIG. 2. In this case, an area of the electrode configuring the MIS is ϕ1 mm. In detail, the measuring condition is as follows. Further, in FIG. 2, 1A indicates the glass substrate, 2A indicates the Mo electrode, 3 indicates the gate insulating layer, 4 indicates the oxide semiconductor layer, 9 indicates the ϕ1 mm Mo electrode, and 10A and 10B indicate the passivation layer.

The ICTS measuring apparatus: PhysTech Manufacturing Co. FT1030 HERA-DLTS

Figure 3:
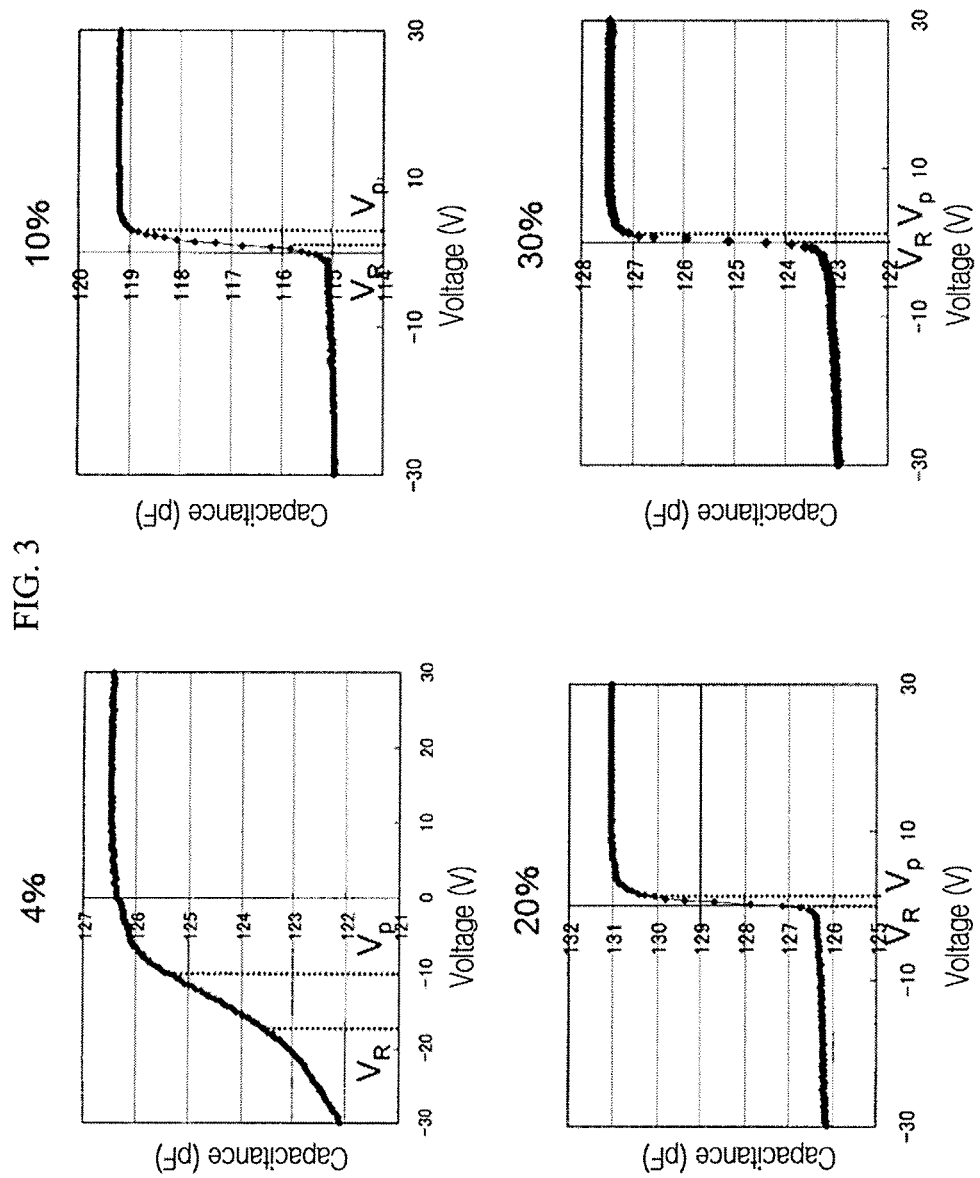
FIG. 3 is a curved line of capacitance (C)-voltage (V) to determine a reverse voltage and a pulse voltage of each oxygen partial pressure of 4% volume, 10% by volume, 20% by volume, and 30% by volume in the ICTS measurement in an exemplary embodiment.

The measuring temperature: 210 K
The reverse voltage: described in FIG. 3
The pulse voltage: described in FIG. 3
The pulse time: 100 msec
The measuring frequency: 1 MHz
The measuring time: $5 \times 10^{-4}$ sec–10 sec In this case, the reverse voltage and the pulse voltage in each oxygen partial pressure of 4% by volume, 10% by volume, 20% by volume, and 30% by volume are the voltage values represented by a curved line of C (capacitance)-V (voltage) of FIG. 3. The details are as follows. In FIG. 3, the interval of the dotted line corresponds to the changed width of the depletion layer. In FIG. 3, % means % by volume.

In the oxygen partial pressure of 4% by volume, the reverse voltage is −17V and the pulse voltage is −10V.

In the oxygen partial pressure of 10% by volume, the reverse voltage is 0.5V and the pulse voltage is 2.5V.

In the oxygen partial pressure of 20% by volume, the reverse voltage is 0V and the pulse voltage is 1V.

In the oxygen partial pressure of 30% by volume, the reverse voltage is 0V and the pulse voltage is 1V.

A value in which the defect density calculated from a size of the changed AC in the measuring time is divided by a correction coefficient is determined as the defect density in the present exemplary embodiment.

The correction coefficient=(Xr−Xp)/Xr

In the equation, Xr means the width of the depletion layer when the reverse voltage is VR, Xp means the width of the depletion layer when the pulse voltage is $V_P$.

Figure 4:
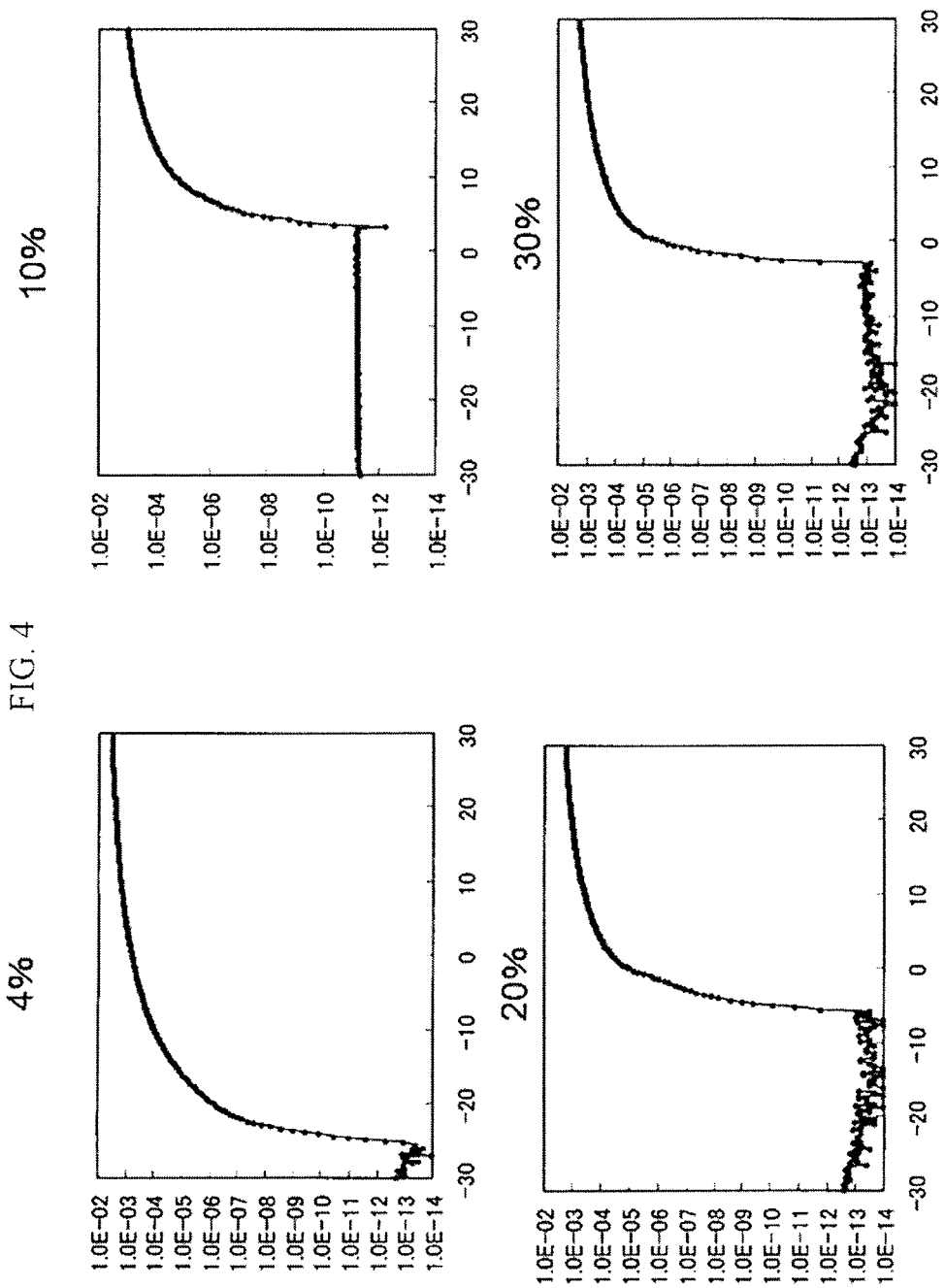
FIG. 4 is a graph showing the result of a drain current-a gate voltage characteristic (Id-Vg characteristic) when changing an oxygen partial pressure in a range of 4-30% by volume in forming a film in an exemplary embodiment.
Figure 5:
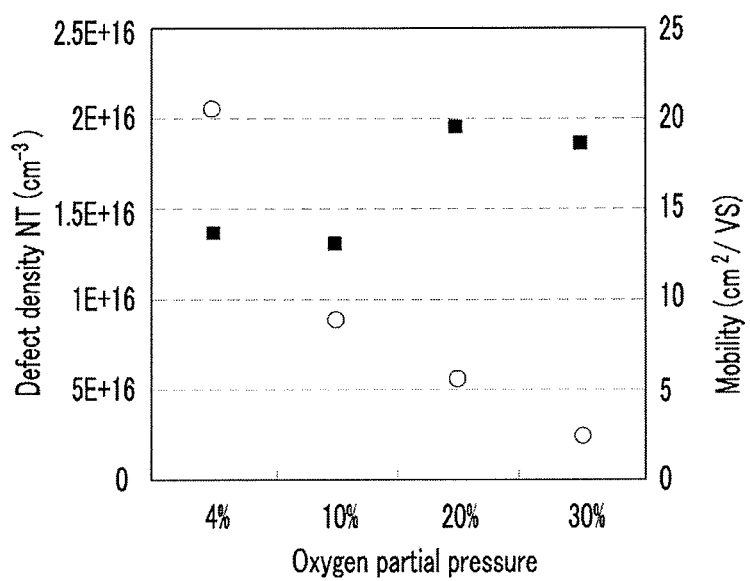
FIG. 5 is a graph showing the relation of an oxygen partial pressure in forming a film and defect density or mobility in an exemplary embodiment.

The result thereof is shown in FIG. 4, FIG. 5, and Table 1. In FIG. 4, FIG. 5, and Table 1, % means % by volume.

FIG. 4 is a graph showing a result of the Id-Vg characteristic when depositing the IZTO layer in each oxygen partial pressure of 4% by volume, 10% by volume, 20% by volume, and 30% by volume. FIG. 5 is a plot showing the result of the defect density and the mobility in each oxygen partial pressure. In FIG. 5, ○ represents the result of the defect density, and ■ represents the result of mobility.

TABLE 1

| Oxygen partial pressure | Defect density NT (cm$^{-3}$) | Mobility (cm$^2$/Vs) |
|---|---|---|
| 4% | 2.05 × 10$^{16}$ | 13.6 |
| 10% | 8.83 × 10$^{16}$ | 12.9 |
| 20% | 5.44 × 10$^{16}$ | 19.5 |
| 30% | 2.17 × 10$^{16}$ | 18.4 |

| 성막시의 산소분압 | 결함밀도 NT (cm$^{-3}$) | 이동도 (cm$^2$/Vs) |
|---|---|---|
| 4% | 2.05 × 10$^{16}$ | 13.6 |
| 10% | 8.83 × 10$^{15}$ | 12.9 |
| 20% | 5.44 × 10$^{15}$ | 19.5 |
| 30% | 2.17 × 10$^{15}$ | 18.4 |

First, reference is made to FIG. 4. A horizontal axis of FIG. 4 is Vg(V), and a vertical axis is Id(A). In FIG. 4, for example, 1.0E-10 means 1.0×10$^{-10}$. As shown in FIG. 4, when the oxygen partial pressure is 20% by volume and 30% by volume, the transistor characteristic seems to be the same at first glance.

However, in fact, as shown in FIG. 5 and Table 1, the defect density and the mobility in the respective oxygen partial pressure are significantly changed. In detail, in the present exemplary embodiment, in the range of the oxygen partial pressure of 4-30% by volume, as the oxygen partial pressure when depositing the IZTO layer is increased, it may be confirmed that the defect density is reduced. On the other hand, the mobility represents the maximum value when the oxygen partial pressure is 20% by volume, after which, the mobility may reflect a tendency to decrease.

Accordingly, based on the measuring condition of the present exemplary embodiment, controlling the oxygen partial pressure at 15% by volume or more, preferably at 20% by volume or more to 30% by volume or less, while keeping the density low, a high mobility may also be obtained.

As described above, to calculate the defect density in addition to managing the mobility of the TFT is extremely important, and if the oxygen partial pressure is appropriately controlled when depositing the IZTO layer as in the present invention, it demonstrates that the TFT combining low defect density and high mobility may be obtained.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

1; substrate
2; gate electrode
3; gate insulating layer
4; oxide semiconductor layer
5; passivation layer (SiO$_2$ film)
6; source/drain electrode
7; surface passivation layer (insulating layer)
8; transparent conductive layer
1A; glass substrate
2A; Mo electrode
9; ϕ1 mm Mo electrode
10A, 10B; passivation layer

What is claimed is:

1. An oxide for a semiconductor layer used as a semiconductor layer of a thin film transistor,
   wherein metal elements constituting the oxide are In, Zn, and Sn,
   an oxygen partial pressure is 15% by volume or more when depositing the oxide in the semiconductor layer of the thin film transistor, and
   a defect density of the oxide satisfies 7.5×10$^{15}$ cm$^{-3}$ or less, and a mobility satisfies 15 cm2/Vs or more.

2. The oxide for the semiconductor layer of claim 1, wherein:
   when a content (atomic %) of each metal element for the total metal elements in the oxide, except for oxygen, is respectively referred to as [In], [Zn] and [Sn], a following relation is satisfied:

1≤[In], 50≤[Zn]≤95, 1≤[Sn]≤30.

3. The oxide for the semiconductor layer of claim 2, wherein: the oxygen partial pressure is 40% by volume or less.

4. The oxide for the semiconductor layer of claim 1, wherein:
   the oxygen partial pressure is 40% by volume or less.

5. A thin film transistor in which the oxide for the semiconductor layer of claim 4 is provided in the semiconductor layer of the thin film transistor.

6. A display device in which the thin film transistor of claim 5 is provided.

* * * * *